United States Patent
Chretien et al.

(10) Patent No.: US 7,789,935 B2
(45) Date of Patent: *Sep. 7, 2010

(54) PHOTOCHEMICAL SYNTHESIS OF METALLIC NANOPARTICLES FOR INK APPLICATIONS

(75) Inventors: Michelle N. Chretien, Mississauga (CA); Naveen Chopra, Oakville (CA); Matthew Heuft, Oakville (CA); Peter M. Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 158 days.

This patent is subject to a terminal disclaimer.

(21) Appl. No.: 12/126,581

(22) Filed: May 23, 2008

(65) Prior Publication Data

US 2009/0288517 A1    Nov. 26, 2009

(51) Int. Cl.
*B22F 9/18*    (2006.01)
(52) U.S. Cl. .................. 75/371; 75/373; 75/374
(58) Field of Classification Search .......... 75/371, 75/373, 374
See application file for complete search history.

(56) References Cited

U.S. PATENT DOCUMENTS

| | | | |
|---|---|---|---|
| 6,887,297 | B2 | 5/2005 | Winter et al. |
| 7,608,204 | B2 * | 10/2009 | Kim et al. ............ 252/512 |
| 2003/0177868 | A1 * | 9/2003 | Guillet .................. 75/722 |
| 2003/0180451 | A1 | 9/2003 | Kodas et al. |
| 2004/0079195 | A1 | 4/2004 | Perry et al. |
| 2004/0175548 | A1 | 9/2004 | Lawrence et al. |
| 2004/0239475 | A1 * | 12/2004 | Hermann et al. ......... 338/25 |
| 2005/0078158 | A1 | 4/2005 | Magdassi et al. |
| 2006/0053972 | A1 | 3/2006 | Liu et al. |
| 2008/0085410 | A1 | 4/2008 | Simone et al. |
| 2009/0181172 | A1 * | 7/2009 | Parpia et al. ............ 427/256 |
| 2009/0226605 | A1 * | 9/2009 | Chopra et al. ........... 427/125 |

FOREIGN PATENT DOCUMENTS

| | | | |
|---|---|---|---|
| JP | 2007070722 A | * | 3/2007 |
| WO | WO 01/90226 A1 | | 11/2001 |
| WO | WO 2004/089813 A2 | | 10/2004 |

OTHER PUBLICATIONS

Machine translation of JP 2007-070722 published Mar. 2007.*
Dhas, N. Arul et al. "Synthesis, Characterization, and Properties of Metallic Copper Nanonparticles", *Chem Mater.*, vol. 10, pp. 1446-1452, 1998.
Volkman, Steven K. et al. "Ink-jetted Silver/Copper conductors for printed RFID applications" *Mat. Res. Soc. Symp. Proc.*, vol. 814, pp. 17.8.1-17.8.6, 2004.
Jana, Nikhil R. et al. "Seed-mediated growth method to prepare cubic copper nanoparticles", *Current Science*, vol. 79, No. 9, pp. 1367-1370, Nov. 10, 2000.
Wu, Chunwei et al. "Simple One-Step Synthesis of Uniform Disperse Copper Nanoparticles", *Mater. Res. Soc. Symp. Proc.*, vol. 879 E, pp. Z6.3.1-Z6.3.6, 2005.
Chen, Ming et al. "Phase transition of silver nanoparticles from aqueous solution to chloroform with the help of inclusion complexes of p-sulfonated calix[4]arene and alkanethiol molecules and its application in the size sorting of nanoparticles", *Nanotechnology*, vol. 18, 175706, pp. 1-7, 2007.
McGilvray, Katherine et al. "Facile Photochemical Synthesis of Unprotected Aqueous Gold Nanoparticles", *J. Am. Chem. Soc.*, vol. 128, No. 50, pp. 15980-15981, 2006.
Kapoor, S. et al. "Photochemical formation of copper nanoparticles in poly(N-vinylpyrrolidone)", *Chemical Physics Letters*, vol. 370, pp. 83-87, 2003.

* cited by examiner

*Primary Examiner*—George Wyszomierski
*Assistant Examiner*—Tima M McGuthry-Banks
(74) *Attorney, Agent, or Firm*—Oliff & Berridge, PLC

(57) ABSTRACT

A method of forming an ink, including photochemically producing stabilized metallic nanoparticles and formulating the nanoparticles into an ink.

16 Claims, No Drawings

PHOTOCHEMICAL SYNTHESIS OF METALLIC NANOPARTICLES FOR INK APPLICATIONS

TECHNICAL FIELD OF THE DISCLOSURE

The present disclosure relates to a method of forming an ink comprising photochemically producing stabilized metallic nanoparticles.

BACKGROUND

Printed electronic features, such as thin film transistor (TFT) electrodes and radio frequency identification (RFID) technology, are an area of intensive research. The ability to directly print electronic features opens the door to a myriad of low-cost flexible electronics with many possibilities for application.

Materials commonly used for printing electronic features include metal materials. In particular, nanoparticulate metal materials are widely-used in printed electronics applications because they have superior characteristics that yield a better product. Metallic nanoparticles are particles having a diameter in the submicron size range. Nanoparticle metals have unique properties, which differ from those of bulk and atomic species. Metallic nanoparticles are characterized by enhanced reactivity of the surface atoms, high electric conductivity, and unique optical properties. For example, nanoparticles have a lower melting point than bulk metal, and a lower sintering temperature than that of bulk metal. The unique properties of metal nanoparticles result from their distinct electronic structure and from their extremely large surface area and high percentage of surface atoms.

Metallic nanoparticles are either crystalline or amorphous materials. They can be composed of pure metal, such as silver, gold, copper, etc., or a mixture of metals, such as alloys, or a core of one or more metals such as copper covered by a shell of one or more other metals such as gold or silver. Nickel has been used for conductive inks for a very limited extent because of its relatively low conductivity (approximately four times less than that of copper or silver). Gold and silver can provide good conductivity, but are relatively expensive. Moreover, gold and silver require high temperatures for annealing, which can pose a challenge for printing on paper and plastic substrates. Copper provides good conductivity at a low price (about one percent of that of silver). Unfortunately, copper is easily oxidized and the oxide is non-conductive. Conventional copper-based nanoparticle inks are unstable and require an inert/reducing, atmosphere during preparation and annealing in order to prevent spontaneous oxidation to non-conductive CuO or $Cu_2O$. Copper polymer thick film inks have been available for many years and can be used for special purposes, for example, where solderability is required. Another interesting strategy is to combine the advantages of both silver and copper. Silver plated copper particles are commercially available, and are used in some commercially available inks. Silver plating provides the advantages of silver for inter-particle contacts, while using the less-expensive conductive metal (copper) for the bulk of the particle material. However, as discussed above, silver is relatively expensive. Thus, there is a need for a reliable, cost-effective method for producing inks that are suitable for printing electronic features.

REFERENCES

U.S. Patent Application Publication No. 2004/0175548 A1 to Lawrence et al. describes a conductive ink that is suitable for gravure or flexographic printing and includes a carboxylic acid or anhydride-functional aromatic vinyl polymer and an electrically conductive material that may be either a particulate material or a flake material, particularly a conductive flake material having an aspect ratio of at least about 5:1.

Dhas et al., *Chem Mater,* 10:1446-52 (1998) discusses a method for metallic copper nanoparticle synthesis by using an argon/hydrogen (95:5) atmosphere in order to avoid formation of impurities, such as copper oxide.

Volkman et al., *Mat. Res. Soc. Proc.,* 814:17.8.1-17.8.6 (2004) describes processes for forming silver and copper nanoparticles, and discusses the optimization of the printing/annealing processes to demonstrate plastic-compatible low-resistance conductors.

Jana et al., *Current Science,* 79(9):1367-70 (Nov. 10, 2000) describes preparation of cubic copper particles, in which cube-shaped copper nanoparticles in the size range of about 75 to 250 nm are formed from smaller spherical copper particles.

Wu et al., *Mater. Res. Soc. Symp. Proc.,* 879E:Z6.3.1-Z6.3.6 (2005) describes a solution-phase chemical reduction method with no inert gas protection for preparing stable copper nanoparticle colloid with average particle size of 3.4 nm and narrow size distribution using ascorbic acid as both a reducing agent and an antioxidant to reduce copper sale precursor and effectively prevent the general oxidation process occurring to the newborn nanoparticles.

Chen et al., *Nanotechnology,* 18:175706-12 (2007) describes silver nanoparticle synthesis in aqueous solution and capped with an inclusion complex of octadecanethiol and p-sulfonated calix[4]arene.

McGilvray et al., *J. Am. Chem. Soc.,* 128(50):15980-81 (2006) describes a photochemical synthesis of stable, unprotected gold nanoparticles that does not require conventional stabilizing ligands, such as sulfur, nitrogen or phosphorous.

Kapoor et al., *Chem. Phys. Letters,* 370:83-7 (2003) describes preparation of copper nanoparticles by photo-reduction of $CuSO_4$ and with 253.7 nm UV light in the presence of poly(N-vinylpyrrolidone) and benzophenone. Kapoor et al., describe that in the formation of Cu nanoparticles, the ketyl radical of benzophenone does not participate.

U.S. Patent Application Publication No. 2006/0053972 A1 to Liu et al. describes a process for producing copper nanoparticles in the form of a solid powder by first reacting an aqueous solution containing a reductant with an aqueous solution of a copper salt, followed by adding an apolar organic solution containing the extracting agent, and then post-treating the reaction product to obtain copper nanoparticles.

U.S. Patent Application Publication No. 2005/0078158 A1 to Magdassi et al. describes compositions for use in inkjet printing onto a substrate via a water-based dispersion including metallic nanoparticles and appropriate stabilizers. Magdassi also describes methods for producing such compositions and methods for their use in ink jet printing onto suitable substrates.

U.S. Pat. No. 6,887,297 to Winter et al. describes methods of making monodisperse nanocrystals via reducing a copper salt with a reducing agent, providing a passivating agent including a nitrogen and/or an oxygen donating moiety, and isolating the copper nanocrystals. Winter also describes methods for making a copper film via the steps of applying a solvent including copper nanocrystals onto a substrate and heating the substrate to form a film of continuous bulk copper from the nanocrystals. Winter also describes methods for filling a feature on a substrate with copper via the steps of applying a solvent including copper nanocrystals onto the featured substrate and heating the substrate to fill the feature by forming continuous bulk copper in the feature.

U.S. Patent Application Publication No. 2003/0180451 to Kodas et al. discloses a precursor composition for the deposition and formation of an electrical feature such as a conductive feature. The precursor composition advantageously has a low viscosity enabling deposition using direct-write tools. The precursor composition also has a low conversion temperature. A particularly preferred precursor composition includes copper metal for the formation of highly conductive copper features.

The above-described methods for creating metallic nanoparticle inks suffer from several drawbacks. The requirements for preparing metallic nanoparticles for incorporation in inks that are suitable for printing electronic features are: stability under atmospheric conditions, small particle size, cost-effectiveness and high throughput yield. However, methods for creating gold and silver nanoparticles are relatively costly. Moreover, when copper is used, most methods require a reducing/inert atmosphere to avoid oxidation of the copper particles. The methods described that do not require a reducing/inert atmosphere suffer from the limitations that the particles formed are too large to be annealed at a lower temperature (<200° C.). Therefore, a high annealing temperature requirement may prohibit printing on paper and plastic substrates. Alternatively, the methods produce low yields. Thus, there exists a need for a method of producing inks that meet these requirements and can be more easily and cost-effectively produced and used.

The appropriate components and process aspects of each of the foregoing may be selected for the present disclosure in embodiments thereof, and the entire disclosures of the above-mentioned references are entirely incorporated herein by reference.

SUMMARY

The present disclosure provides a method of forming an ink comprising photochemically producing stabilized metallic nanoparticles and formulating the nanoparticles into an ink. The ink may be printed onto a substrate. The printed ink may be annealed.

The advantages of the present disclosure are numerous. The ink including the metallic nanoparticles may be annealed at a lower temperature than the conventional annealing temperature. Therefore, the ink can be printed on a wide variety of substrates, including paper and plastic substrates. The method is also fast, and thus large quantities of nanoparticles can be produced rapidly, in a matter of seconds to a few minutes. The method is also versatile. Bare, unprotected nanoparticles are produced, and the nanoparticles can be stabilized with virtually any molecule by extracting the nanoparticles into an organic solvent containing a stabilizer of choice. Additionally, there are numerous combinations of metals and reducing radical pairs that may be used in this method. For instance, copper can be used in this method. Therefore, this method offers a cheaper alternative to synthesis of metallic nanoparticles using more expensive metals, such as platinum, gold or silver. The size and/or concentration of the nanoparticles can be easily controlled by changing one or more of the parameters of this method, such as irradiation time, irradiation intensity, the metal counter-ion used, and/or the concentrations of the metal or the photoinitiator. Finally, the method is ecologically-friendly because it does not require harsh reducing agents, and can be performed at room temperature in water.

EMBODIMENTS

This disclosure is not limited to particular embodiments described herein, and some components and processes may be Varied by one of ordinary skill in the art, based on this disclosure. The terminology used herein is for the purpose of describing particular embodiments only, and is not intended to be limiting.

In this specification and the claims that follow, singular forms such as "a," "an," and "the" include plural forms unless the content clearly dictates otherwise.

Generally, the present disclosure provides a method of forming an ink comprising photochemically producing stabilized metallic nanoparticles and formulating the nanoparticles into an ink. Generally, the ink may be printed onto a substrate and also may be annealed. The methods are now described in further detail below.

Synthesis of the Metallic Nanoparticles

Generally, metallic nanoparticles may be produced in an aqueous solution by reduction of one or more metallic ions with a reducing agent. The aqueous solution may be deaerated.

The metallic ions are provided as metal salts. Suitable metallic ions provided as metal salts include ions of copper, aluminum, magnesium, manganese, zinc, chromium, lead, cadmium, cobalt, nickel, gold, silver, platinum, tin, palladium, indium, iron, tungsten, molybdenum, ruthenium, bismuth, other suitable metal ions, and mixtures thereof. For example, the metal salt can be provided in the form of metal sulfates, metal halides (such as metal chlorides or metal bromides), metal nitrates, metal acetates, metal nitrites, metal oxides, metal carbonates, metal hydroxides, metal oxalates, metal pyrazolyl borates, metal azides, metal fluoroborates, metal carboxylates, metal halogencarboxylates, metal hydroxycarboxylates, metal aminocarboxylates, metal aromatic and nitro and/or fluoro substituted aromatic carboxylates, metal aromatic and nitro and/or fluoro substituted aromatic carboxylates, metal beta diketonates, metal sulfonates, and the like.

In one embodiment, the metal ions are provided as copper (II) ions. The copper (II) ions can be incorporated into metal salts such as, for example, copper sulfate, copper chloride, copper nitrate, or copper acetate. Of course, other metals, and other metal salts, can also be used.

As the reducing agent, one or more photochemically generated radicals may be used. The radicals react with one or more metal cations ($M^+$, $M^{2+}$, etc., wherein M represents a suitable metal), to produce $M^0$ metal atoms and ultimately unprotected metal nanoparticles. Suitable reducing agents include, for example, a radical. Examples of suitable radicals include, for example, ketyl, $\alpha$-amino, phosphinoyl, benzoyl, and acyl radicals. The radicals used according to the present disclosure may be provided from any known source, including commercially available sources. In one embodiment, the radicals are produced by Norrish Type I cleavage of $\alpha$-hydroxy or $\alpha$-aminoketones. Such radicals are also commercially available as, for example, Ciba commercial photoinitiators IRGACURE® 184, 127, 2959, 369, 379, etc. In another embodiment, the radicals are produced by a Norrish Type II photoinitiation process, in which a photoexcited ketone (such as, for example, benzophenone) abstracts a proton from a proton donor molecule (such as, for example, isopropanol) to generate two ketyl radicals.

In embodiments, the aqueous solution of metallic nanoparticles and the reducing agent are irradiated for from about 5 seconds to about 90 seconds, such as from about 10 to about 45 seconds or from about 15 to about 30 seconds. The intensity of irradiation is from about 0.001 W/cm$^2$ to about 10 W/cm$^2$, such as from about 0.05 W/cm$^2$ to about 5 W/Cm$^2$, or from about 0.1 W/cm$^2$ to about 1 W/cm$^2$. The source of irradiation may generally be any source known in the art, such as, for example, by UV or visible radiation. This results in the synthesis of uncoated metallic nanoparticles.

The metallic nanoparticles produced are desirably in the nanometer size range. For example, in embodiments, the metallic nanoparticles have an average particle size of from about 1 to about 1000 nm, such as from about 50 to about 500 nm, or about 100 to about 200 nm, or about 2 to about 20 nm. Herein, "average" particle size is typically represented as $d_{50}$, or defined as the median particle size value at the 50$^{th}$ percentile of the particle size distribution, wherein 50% of the particles in the distribution are greater than the $d_{50}$ particle size value, and the other 50% of the particles in the distribution are less than the $d_{50}$ value. Average particle size can be measured by methods that use light scattering technology to infer particle size, such as Dynamic Light Scattering. The particle diameter refers to the length of the pigment particle as derived from images of the particles generated by Transmission Electron Microscopy.

The size of the nanoparticle formed may be controlled by changing the irradiation time and intensity, the metal counterion, modifying the concentration of the metal ion and/or the photoinitiator, or by other means.

The metallic nanoparticles may be in any shape. Exemplary shapes of the metallic nanoparticles can include, without limitation, needle-shape, granular, globular, spherical, amorphorous shapes, and the like.

Next, the uncoated or functionalized particles are dispersed in the appropriate vehicle for formulation into an ink.

Once prepared, the uncoated metallic nanoparticles may be suspended in an aqueous solution. These unprotected, uncoated metallic nanoparticles may be functionalized by any suitable means known in the art. Moreover, the metallic nanoparticles may be stabilized. Stabilization of the particles may be achieved by adding stabilizing molecules directly to the aqueous solution containing the nanoparticles. Alternatively, the nanoparticles can be extracted into an organic solvent containing the stabilizing molecules. For example, copper nanoparticles may be stabilized with a substituted dithiocarbonate. In another example, silver nanoparticles may be stabilized with organic acids or amines, such as oleic acid or oleylamine. In another example, gold particles capped with alkylthiol can be used. Other suitable stabilizers for use according to the present disclosure Generally include, without limitation, organic stabilizers. The term "organic" in "organic stabilizer" refers to, for example, the presence of carbon atom(s), but the organic stabilizer may include one or more non-metal heteroatoms such as nitrogen, oxygen, sulfur, silicon, halogen, and the like. Examples of other organic stabilizers may include, for example, thiol and its derivatives, —OC(=S)SH (xanthic acid), dithiocarbonates, polyethylene glycols, polyvinylpyridine, polyninylpyrolidone, alkyl xanthate, ether alcohol based xanthate, amines, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid and combinations thereof.

Formulating the Metallic Nanoparticles Into an Ink

The ink composition according to the present disclosure generally includes metallic nanoparticles and an ink vehicle, such as a carrier solvent, or a mixture of two or more carrier solvents.

Generally, suitable solvent or carrier media can be polar or non-polar Solvents that are useful according to the present disclosure include, without limitation, amines, amides, alcohols, terpene alcohols, esters, water, ketones, ethers, aromatics, substituted aromatics, terpenes, essential oils, aldehydes, alkenes, unsaturated hydrocarbons, saturated hydrocarbons, mineral acids, organic acids and bases. Other suitable solvents include, without limitation, N,N,-dimethylacetamide, diethyleneglycol butylether, ethanolamine and N-methylpyrrolidone, dichloromethane, methyl ethyl ketone, toluene, ketones, benzene, chlorotoluene, nitrobenzene, dichlorobenzene, N-methylpyrrolidinone, A dimethylacetamide, ethylene glycol, diethylene glycol, diethylene glycol butyl ether and propylene glycol.

The solvent can be a high melting point solvent, such as one having a melting point of at least about 30° C. and not greater than about 100° C. A heated inkjet head can be used to deposit the metallic nanoparticle ink composition while in a flowable state, whereby the solvent solidifies upon contacting the substrate. Subsequent processing can then remove the solvent by other means and then convert the material to the final product, thereby retaining resolution. Suitable solvents include waxes, high molecular weight fatty acids, alcohols, acetone, N-methyl-2-pyrrolidone, toluene, tetrahydrofuran, and the like. Alternatively, the metallic nanoparticle ink composition may be a liquid at room temperature, where the substrate is kept at a lower temperature below the freezing point of the composition.

The solvent can also be a low melting point solvent. A low melting point is required when the precursor composition must remain as a liquid on the substrate until dried. A suitable low melting point solvent is N,N,-dimethylacetamide, which has a melting point of about –20° C.

In addition, the solvent can be a low vapor pressure solvent. A lower vapor pressure advantageously prolongs the work life of the composition in cases where evaporation in the ink-jet head, syringe or other tool leads to problems such as clogging. Suitable solvents for this purpose include terpineol, diethylene glycol, ethylene glycol, hexylene glycol, N-methyl-2-pyrrolidone, and tri(ethylene glycol) dimethyl ether.

The solvent can also be a high vapor pressure solvent, such as one having a vapor pressure of at least about 1 kPa. A high vapor pressure allows rapid removal of the solvent by drying. High vapor pressure solvents include acetone, tetrahydrofuran, toluene, xylene, ethanol, methanol, 2-butanone and water.

To formulate the ink, about 0.5 to about 35 weight % of the metallic nanoparticles may be dispersed in an ink vehicle, such as from about 1 to about 30 weight % or from about 5 to about 25 weight % or from about 10 to about 20 weight %. The ink provides improved conductivity of about 2× to about 40×, such as from about 10× to about 35× or about 15× to 20×.

The viscosity of the ink may be from about 1 centipoise to about 100 centipoise, such as from about 10 centipoise to about 75 centipoise, or from about 20 centipoise to about 50 centipoise. Here, viscosity is measured at 25° C.

Carrier Material

The ink composition also includes a carrier material, or a mixture of two or more carrier materials. The carrier material may vary depending upon the specific type of ink composition. For example, an aqueous ink jet ink composition can use water, or a mixture of water and one or more other solvents, as a suitable carrier material. Other ink jet ink compositions can use one or more organic solvents as a carrier material, with or without water.

Additional Additives

The ink according to the present disclosure may further contain one or more additives for their known purposes. For example, suitable additives include, a fluidization agent such as colloidal silica; lubricants such as metal salts of fatty acids; wax, surfactants, silica; a spacing agent; a dryer; a dispersant; a humectant; a cross-linking agent; a stabilizer; a thickening agent; a gelatinizing agent; a defoaming agent; and an initiator for photopolymerization. It is worth noting however, that additional additives, if not removed in the annealing step, may reduce the conductivity of the conductive feature.

The ink compositions can also optionally contain an antioxidant. The optional antioxidants of the ink compositions protect the images from oxidation and also protect the ink components from oxidation during the heating portion of the ink preparation process. Specific examples of suitable antioxidants include NAUGUARD® series of antioxidants, such as NAUGUARD® 445, NAUGUARD® 524, NAUGUARD® 76, and NAUGUARD® 512 (commercially available from Uniroyal Chemical Company, Oxford, Conn.), the IRGANOX® series of antioxidants such as IRGANOX® 1010 (commercially available from Ciba Geigy), and the like. When present, the optional antioxidant can be present in the ink in any desired or effective amount, such as in an amount of from at least about 0.01 to about 20 percent by weight of the ink, such as about 0.1 to about 5 percent by weight of the ink, or from about 1 to about 3 percent by weight of the ink, although the amount can be outside of these ranges.

The ink compositions can also optionally contain a viscosity modifier. Examples of suitable viscosity modifiers include aliphatic ketones, such as stearone, and the like. When present, the optional viscosity modifier can be present in the ink in any desired or effective amount, such as about 0.1 to about 99 percent by weight of the ink, such as about 1 to about 30 percent by weight of the ink, or about 10 to about 15 percent by weight of the ink, although the amount can be outside of these ranges.

Other optional additives to the inks include clarifiers, such as UNION CAMP® X37-523-235 (commercially available from Union Camp); tackifiers, such as FORAL® 85, a glycerol ester of hydrogenated abietic (rosin) acid (commercially available from Hercules), FORAL® 105, a pentaerythritol ester of hydroabietic (rosin) acid (commercially available from Hercules), CELLOLYN® 21, a hydroabietic (rosin) alcohol ester of phthalic acid (commercially available from Hercules), ARAKAWA® KE-311 Resin, a triglyceride of hydrogenated abietic (rosin) acid (commercially available from Arakawa Chemical Industries, Ltd.); synthetic polyterpene resins such as NEVTAC® 2300, NEVTAC® 100, and NEVTAC® 80 (commercially available from Neville Chemical Company), WINGTACK® 86, a modified synthetic polyterpene resin (commercially available from Goodyear), and the like; adhesives, such as VERSAMID® 757, 759, or 744 (commercially available from Henkel); plasticizers, such as UNIPLEX® 250 (commercially available from Uniplex), the phthalate ester plasticizers commercially available from Monsanto under the trade name SANTICIZER®, such as dioctyl phthalate, diundecyl phthalate, alkylbenzyl phthalate (SANTICIZER® 278), triphenyl phosphate (commercially available from Monsanto), KP-140®, a tributoxyethyl phosphate (commercially available from FMC Corporation), MORFLEX® 150, a dicyclohexyl phthalate (commercially available from Morflex Chemical Company Inc.), trioctyl trimellitate (commercially available from Eastman Kodak Co.), and the like; and the like. Such additives can be included in conventional amounts for their usual purposes.

Surfactants

Examples of nonionic surfactants that may be used in the ink according to the present disclosure include, without limitation, polyvinyl alcohol, polyacrylic acid, methalose, methyl cellulose, ethyl cellulose, propyl cellulose, hydroxy ethyl cellulose, carboxy methyl cellulose, polyoxyethylene cetyl ether, polyoxyethylene lauryl ether, polyoxyethylene octyl ether, polyoxyethylene octylphenyl ether, polyoxyethylene oleyl ether, polyoxyethylene sorbitan monolaurate, polyoxyethylene stearyl ether, polyoxyethylene nonylphenyl ether, dialkylphenoxypoly(ethyleneoxy)ethanol, and the like, and mixtures thereof. A suitable concentration of the nonionic surfactant is, for example, from about 0.01 to about 10 percent by weight, and in some embodiments in an amount of about 0.1 to about 5 percent by weight.

Examples of suitable cationic surfactants include, without limitation, alkylbenzyl dimethyl ammonium chloride, dialkyl benzenealkyl ammonium chloride, lauryl trimethyl ammonium chloride, alkylbenzyl methyl ammonium chloride, alkyl benzyl dimethyl ammonium bromide, benzalkonium chloride, cetyl pyridinium bromide, $C_{12}$, $C_{15}$, $C_{17}$ trimethyl ammonium bromides, halide salts of quaternized polyoxyethylalkylamines, dodecylbenzyl triethyl ammonium chloride, and the like, and mixtures thereof. A suitable amount of surfactant can be selected, such as in an amount of about 0.1 to about 10 percent by weight, and in some embodiments in an amount of about 0.2 to about 5 percent by weight. The choice of particular surfactants or combinations thereof as well as the amounts of each to be used are within the purview of those skilled in the art.

Preparation of Ink

The ink according to the present disclosure may be, for example, an aqueous ink, an oil ink, and the like.

Printing of the Ink

The ink according to the present disclosure may generally be printed on a suitable substrate such as, without limitation, paper, glass art paper, bond paper, paperboard, Kraft paper, cardboard, semi-synthetic paper or plastic sheets, such as polyester or polyethylene sheets, and the like. These various substrates can be provided in their natural state, such as uncoated paper, or they can be provided in modified forms, such as coated or treated papers or cardboard, printed papers or cardboard, and the like.

For printing the ink of the present disclosure on a substrate, any suitable printing method may be used. For example, suitable methods include, without limitation, roll-to-roll high volume analog printing methods, such as gravure, rotogravure, flexography, lithography, etching, screenprinting, and the like. Additionally, thermography, electrophotography, electrography, laser induced transfer, inkjet printing, or a combination thereof may be used. If a laser induced transfer digital printing method is used, exemplary methods of such method are dye sublimination, ablation, melt transfer, or film transfer. The ink may also be used for a thermal transfer printer, a hot-melt printer and ordinary instrument for writing. In a particular embodiment, the method used is inkjet printing.

Annealing the Printed Ink

After printing the ink on a suitable substrate, annealing of the ink to the substrate can be done by suitable means in the art. Generally, the annealing is performed at a temperature of less than about 120° C. for about 10 minutes. The printing and annealing steps are generally performed in an ambient environment. Generally, an ambient environment refers to a normal atmospheric air environment, not requiring the presence of an inert gas environment. In addition, the printing and annealing steps can be performed simultaneously or consecutively.

Optionally, additional processing steps, such as any of overcoating, drying and rinsing, alone or in combination, may follow the printing step.

For the optional overcoating step, any suitable overcoating may be applied after the annealing process is completed. For example, a suitable overcoating can be applied to cover and protect the printed metal wires, such as to protect them from abrasion, chemical attack, or the like. When so applied, the overcoating, can be of any desired thickness, opacity, transparency, or the like.

Additionally, an optional drying step may follow the precipitation and deposition of the ink on the substrate. In some embodiments, the ink is allowed to dry for about 5 minutes at 80° C.

Applications of the Present Disclosure

The present disclosure offers many possible applications. The printing process of this disclosure may be used to manufacture electronic and electrical circuit systems, including electrical interconnects electronic components. Moreover, the printing process of this disclosure may be used to print electrical components, including resistors, capacitors, inductors, RFID tags, thin film transistor electrodes, as well as electric circuits. Additionally, the printing process of this disclosure may be used to print microwave strip line structures directly onto flexible substrates to form microwave integrated circuits (MICs), and microwave antennas. It should be noted that it is feasible to print any type of antenna with the process according to the present disclosure, including, for example, BF coils, UHF fan-shaped antennas, and fibers.

An example is set forth herein below and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

For each of the copper salts CuCl, Cu(SO$_4$), Cu(NO$_3$)$_2$, a 3-mL quartz cuvette containing 0.33 mM of a copper salt and 1.0 mM of IRGACURE® 2959 (an α-hydroxyketone photoinitiator) was degassed with argon for 5 minutes, and then subsequently irradiated using a Fusion UV Lighthammer 6 exposure unit (typical output: UVB: 1.8 W/cm$^2$; UVA 1.9 W/cm$^2$) for various times.

The resulting solution was monitored spectroscopically for the appearance of the Cu$^0$ plasmon band (~350 nm), and the particle size was determined by light scattering (Malvern Zetasizer).

Copper particles formed in a solution of Cu(NO$_3$)$_2$, as indicated by an increase in the absorption spectrum between 350 nm and 400 nm. Short irradiation times (15 seconds) resulted in increased absorption at 350-400 nm, and the formation of ~250 nm particles was measured by light scattering. Due to the overlapping absorbance of the ketyl radical precursor (IRGACURE® 2959), the Cu plasmon band appeared as a shoulder at between 350-400 nm.

CuCl and Cu(SO$_4$) were irradiated for about 45-90 seconds. This resulted in a further red-shift of the 350-400 nm band and the appearance of a band at ~600 nm. The average particle size in these solution increased to 1000 nm in diameter. For Cu(NO$_3$)$_2$, when the radiation time was increased to 45 seconds, no band at ~600 nm was observed.

Irradiating a sample of CuCl and Irgacure 2959 for 45 seconds produced particles having a Z-average diameter of 1100 nm. Irradiating a sample of Cu(NO$_3$)$_2$ and Irgacure 2959 for 15 second produced particles having a Z-average diameter of 232 nm. Finally, irradiating a sample of Cu(NO$_3$)$_2$ and Irgacure 2959 three times for 15 seconds each produced particles having a Z-average diameter of 502 nm.

This data demonstrates that uncoated copper nanoparticles can be quickly and easily prepared in deaerated, aqueous solutions of Cu(I) and Cu(II) salts via reduction with a ketyl radical. Additionally, the size of the nanoparticles can be altered by changing one or more of the following parameters: the irradiation time, the intensity of the irradiation, the metal counter-ion, and/or the reactant concentrations.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of forming an ink, comprising:
photochemically producing stabilized metallic nanoparticles; and formulating the nanoparticles into an ink,
wherein photochemically producing stabilized metallic nanoparticles comprises reducing one or more metallic salts with one or more reducing agents to form uncoated metallic nanoparticles,
wherein the reducing agent is a radical produced by a Norrish Type I cleavage of alpha-hydroxy or alpha-aminoketone.

2. The method according to claim 1, wherein the metallic nanoparticles are gold, silver, copper, platinum, palladium, nickel, rhodium, or combinations thereof.

3. The method according to claim 2, wherein the metallic nanoparticles are copper.

4. The method according to claim 1, wherein the anion of the metallic salts are sulfates, halides, nitrates, acetates, formates, phosphates, acetylacetonates, carbonates, bromides, iodides or a mixture thereof.

5. The method according to claim 1, wherein the metallic salt is provided in a deaerated aqueous solution.

6. The method according to claim 1, wherein the metallic particles are about 5 nm to about 1100 nm in size.

7. The method according to claim 1, wherein the metallic nanoparticles are about 30 nm to about 400 nm in size.

8. The method according to claim 1, wherein the nanoparticles are functionalized prior to being formulated into an ink.

9. The method according to claim 1, wherein the photochemically producing stabilized metallic nanoparticles comprises photochemically producing the metallic nanoparticles suspended in an aqueous solution comprising a nanoparticle stabilizer.

10. The method according to claim 1, wherein the photochemically producing stabilized metallic nanoparticles comprises extracting the metallic nanoparticles into an organic solvent comprising a nanoparticle stabilizer.

11. The method according to claim 1, wherein the ink is a liquid ink.

12. The method according to claim 11, wherein the ink is an inkjet ink.

13. A method of printing an ink comprising:
photochemically producing stabilized metallic nanoparticles; formulating the nanoparticles into an ink; and printing the ink onto a substrate
wherein photochemically producing stabilized metallic nanoparticles comprises reducing one or more metallic salts with one or more reducing agents to form uncoated metallic nanoparticles,
wherein the reducing agent is a radical produced by a Norrish Type I cleavage of alpha-hydroxy or alpha-aminoketone.

14. The method according to claim 13, wherein the printed ink forms conductive wires or films.

15. The method according to claim 13, wherein the method is used for printed electronic applications.

16. A method of annealing printed ink comprising:
photochemically producing stabilized metallic nanoparticles; formulating the nanoparticles into an ink; printing the ink onto a substrate; and annealing the printed ink
wherein photochemically producing stabilized metallic nanoparticles comprises reducing one or more metallic salts with one or more reducing agents to form uncoated metallic nanoparticles,
wherein the reducing agent is a radical produced by a Norrish Type I cleavage of alpha-hydroxy or alpha-aminoketone.

* * * * *